(12) United States Patent  (10) Patent No.: US 6,475,023 B2
Carneling  (45) Date of Patent: Nov. 5, 2002

(54) SURFACE MOUNT HOLDING FEATURE

(75) Inventor: Hard A. Carneling, Valla (SE)

(73) Assignee: FCI Americas Technology, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/878,290

(22) Filed: Jun. 11, 2001

(65) Prior Publication Data

US 2001/0031576 A1 Oct. 18, 2001

Related U.S. Application Data

(63) Continuation of application No. 09/210,073, filed on Dec. 11, 1998, now Pat. No. 6,270,374
(60) Provisional application No. 60/071,862, filed on Jan. 20, 1998.

(51) Int. Cl.[7] ............................................... H01R 13/71
(52) U.S. Cl. ........................ 439/488; 439/940; 382/123
(58) Field of Search ................................. 439/488, 491, 439/65, 80, 79, 83, 562, 564, 571, 572, 940; 29/740, 840; 422/108, 62; 382/123, 144; 356/239

(56) References Cited

U.S. PATENT DOCUMENTS

| | | |
|---|---|---|
| 3,904,266 A | 9/1975 | Fitzpatrick |
| 4,462,046 A | 7/1984 | Spight |
| 4,628,410 A | 12/1986 | Goodman et al. |
| 4,955,819 A | 9/1990 | Harting et al. |
| 5,022,862 A | 6/1991 | Martin et al. |
| 5,037,327 A | 8/1991 | van Woensel |
| 5,040,291 A | 8/1991 | Janisewicz et al. |
| 5,096,440 A | 3/1992 | Katsumata |
| 5,189,707 A | 2/1993 | Suzuki et al. |
| 5,334,049 A | 8/1994 | Kachlic et al. |
| 5,383,797 A | 1/1995 | Seing et al. |
| 5,386,489 A | 1/1995 | Schell |
| 5,423,691 A | 6/1995 | Pickles |
| 5,568,593 A | 10/1996 | Demarest et al. |
| 5,591,050 A | 1/1997 | Sueoka |
| 5,593,307 A | 1/1997 | Bale et al. |
| 5,609,500 A | 3/1997 | Homer et al. |
| 5,613,864 A | 3/1997 | Northey |
| 5,622,519 A | 4/1997 | Bixler et al. |
| 5,713,762 A | 2/1998 | Mitra et al. |
| 5,738,534 A | 4/1998 | Ingles et al. |
| 5,863,222 A * | 1/1999 | Kinsey, Jr. et al. ......... 439/607 |
| 5,928,035 A * | 7/1999 | Jankowsky et al. ......... 439/607 |
| 5,934,939 A * | 8/1999 | Thenaisie et al. ........... 439/607 |

FOREIGN PATENT DOCUMENTS

DE 3925958 C1 2/1991

\* cited by examiner

Primary Examiner—Hien Vu
(74) Attorney, Agent, or Firm—M. Richard Page; Steven M. Reiss

(57) ABSTRACT

An electrical connector having a metal plate which is mounted under the housing with hot riveting. Location pegs are made so that low mounting force is possible. A wafer which is black in color or has another contrasting color makes it possible for a video camera to record the true position of the terminals. The surface of the top side of the housing is suited for vacuum pick up.

8 Claims, 7 Drawing Sheets

SURFACE MOUNT HOLDING FEATURE

This appl. is a continuation of U.S. appl. Ser. No. 09/210,073, filed Dec. 11, 1998, now U.S. Pat. No. 6,270,374, which claims priority from provisional appl. No. 60/071,862, filed Jan. 20, 1998.

BACKGROUND OF THE INVENTION

1. Field of the Invention

The present invention relates to electrical connectors and more particularly to hold-down devices for electrical connectors.

2. Brief Description of Prior Developments

One conventional method of positioning connectors and other electronic components on a printed circuit board (PCB) is by means of surface mount technology (SMT) through-mount or intrusive reflowed terminals. Intrusive reflow is the pre-location of carefully applied dosage amount of solder in the plated through hole such that after reflow (and not wave solder) operation a uniformly filled solder meniscus is formed with the terminal located in the hole. The connector may be picked up by a vacuum nozzle or similar transport means from a tape and then appropriately positioned and fixed on the PCB.

There is a need for such a device which is available on the (redundant) underside of a connector whether this connector is a receptacle or a plug connector. Unlike many other hold-down devices, the means to activate the hold-down mechanism in association with extraneous mechanical forces is avoided. This feature can be important in order to avoid rupture of delicate multi-layer boards, and thus cause undue stresses at the terminal solder connections.

SUMMARY OF THE INVENTION

In the connector of the present invention a metal plate is mounted under the housing with hot riveting. Location pegs are made so that low mounting force is possible. A wafer which has a dark or other contrasting color to make it possible for a video camera to record the true position of the terminals. The surface of the top side of the housing is suited for vacuum pick up.

BRIEF DESCRIPTION OF THE DRAWINGS

The connector of the present invention is further described with reference to the accompanying drawings in which.

DETAILED DESCRIPTION OF THE DRAWINGS

Figure 1:
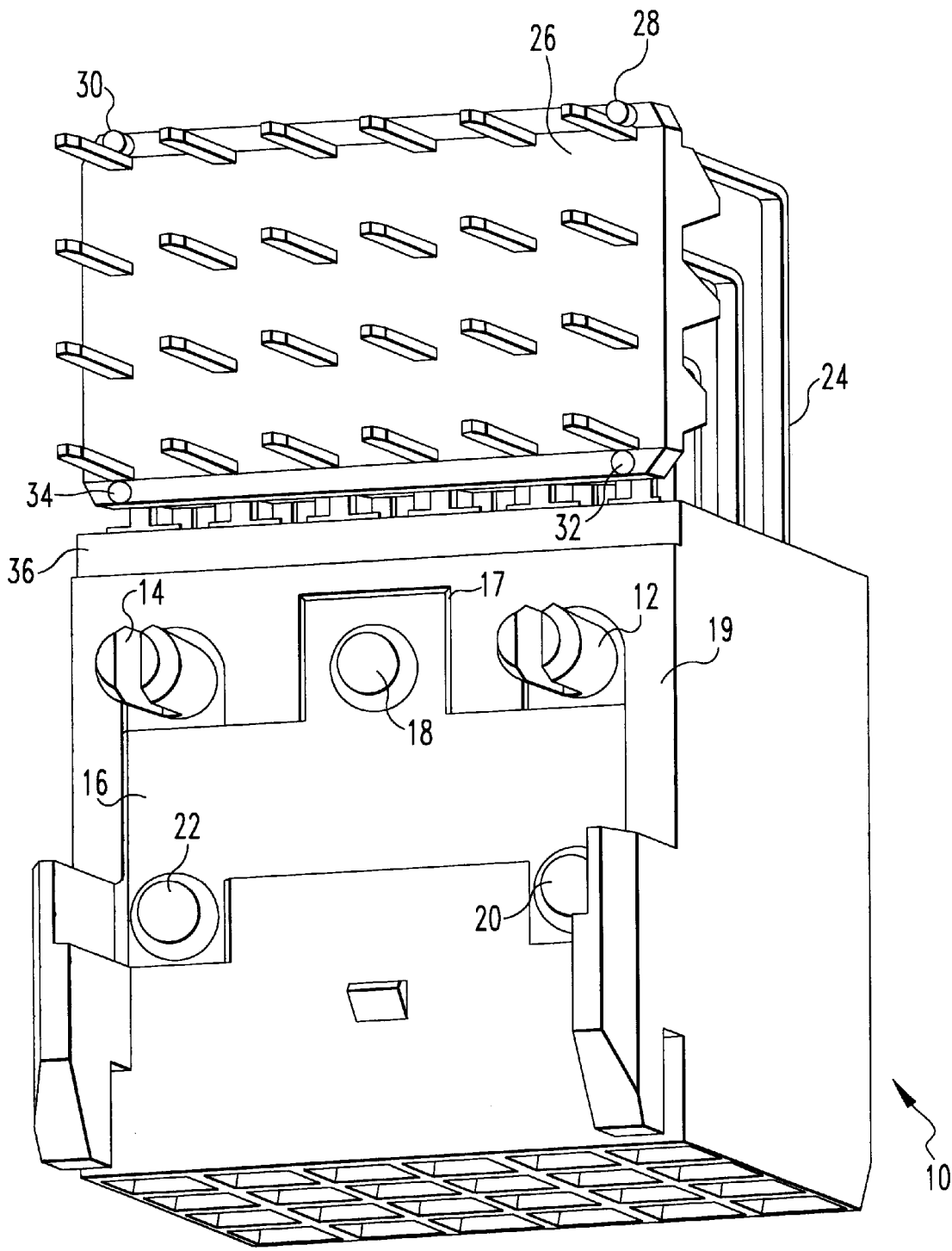
FIG. 1 is a bottom perspective view of a preferred embodiment of the receptacle of the present invention and a wafer used in its placement.

Referring to FIG. 1, a METRAL receptacle which is commercially available from FCI/Berg Electronics Group, Inc. located at Etters, Pennsylvania is shown generally at numeral 10. This header includes a bifurcated resilient location pin 12 and location pin 14 on the underside 19 of the connector which includes a recessed area with a perimeter 17. This recessed area contains three hot rivet pegs 18, 20 and 22. An additional feature of this connector according to the novelty is that an appropriately stamped metal plate 16 with three circular apertures (not shown) accepts the hot rivet pegs 18, 20 and 22 while fitting into the recessed area defined by the perimeter 17.

Extending rearwardly and downwardly from the insulation housing are a plurality of contact terminals 24 which are grouped and bent at an angle of 90 degrees to engage and pass through a wafer 26. This wafer preferably has standoffs 28, 30, 32 and 34 with a height and location such that they, or the lower surface of the wafer disturb the relatively soft paste on opposing area after location on the printed circuit board (see FIG. 5). In addition, a channel or space 36 is located along connector width intermediary to the underside 19 of the connector and the wafer 26. Its function will be explained later.

Figure 2:
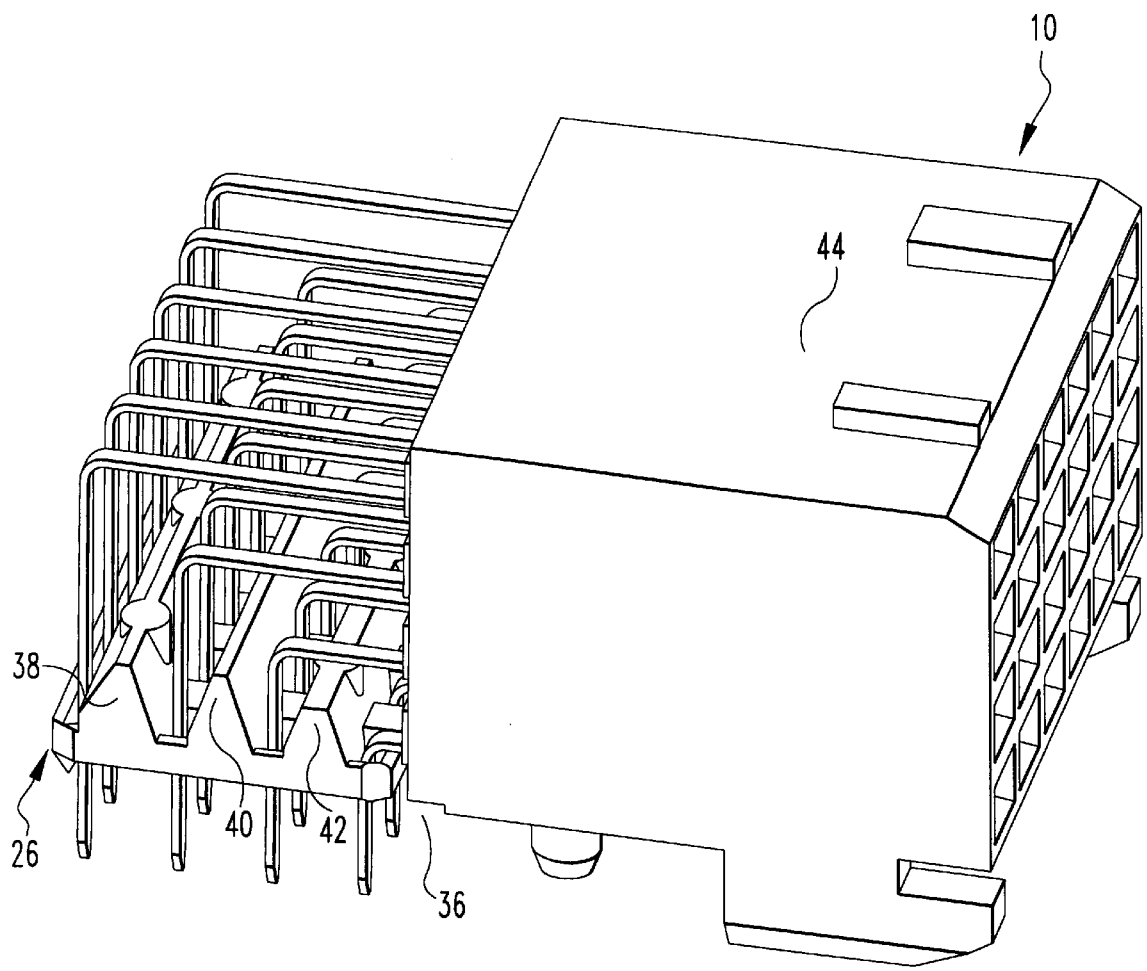
FIG. 2 is a top perspective view of the connector and wafer shown in FIG. 1.

As is further evident from FIG. 2, the wafer has a plurality of ridges 38, 40 and 42 and between these ridges there are grooves which contain the apertures (not shown) through which the connector terminal bent leads are introduced. Such a wafer is preferably black in color to facilitate a visual inspection of the terminals. Further, as shown such a connector will have a flat surface 44 typically suited to vacuum pick-up by a robot assisted connector assembly on the board.

Figure 2A:
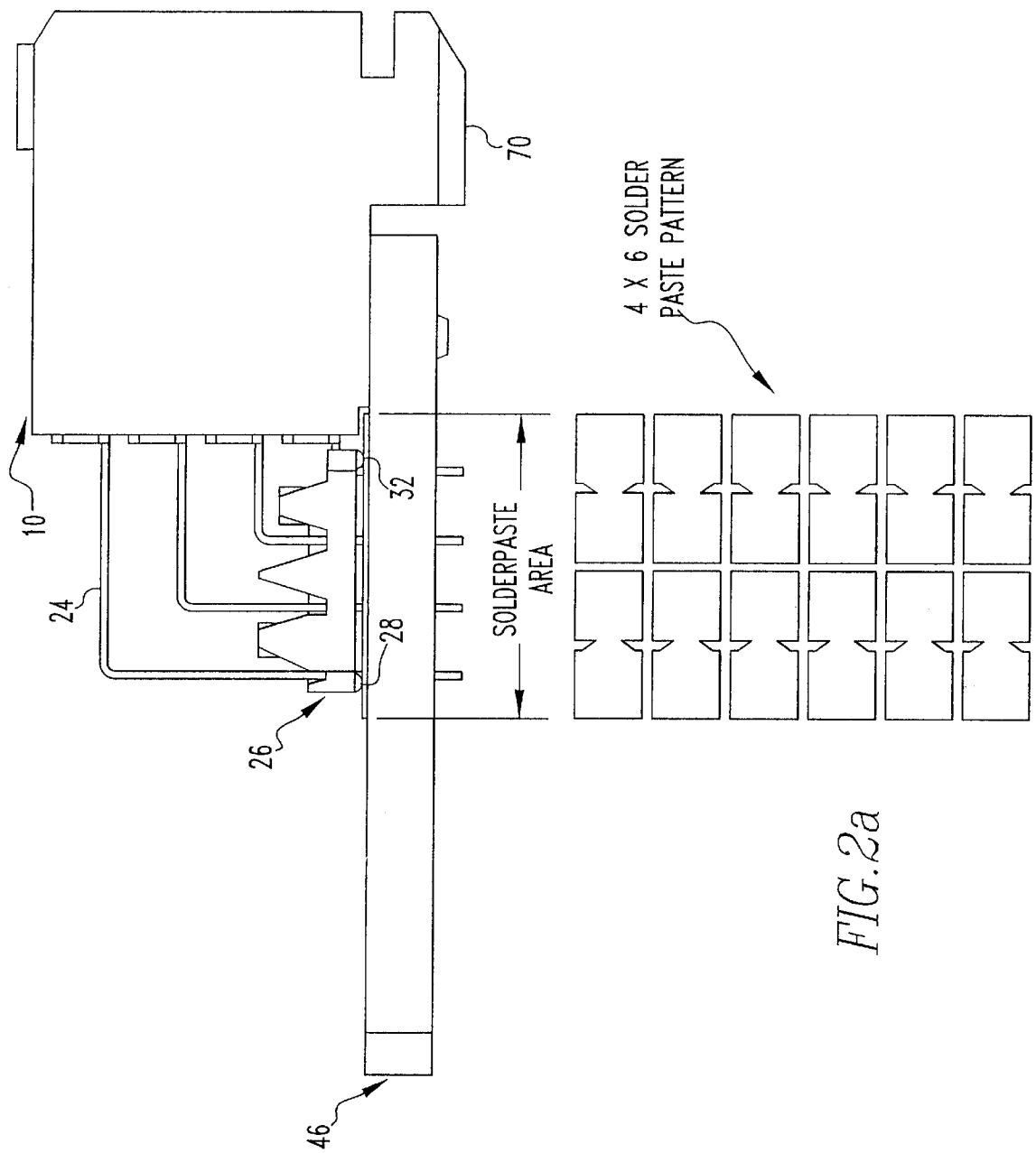
FIG. 2a is a side elevational view of the receptacle and wafer shown in FIG. 2 and a plan view of the wafer.
Figure 2B:
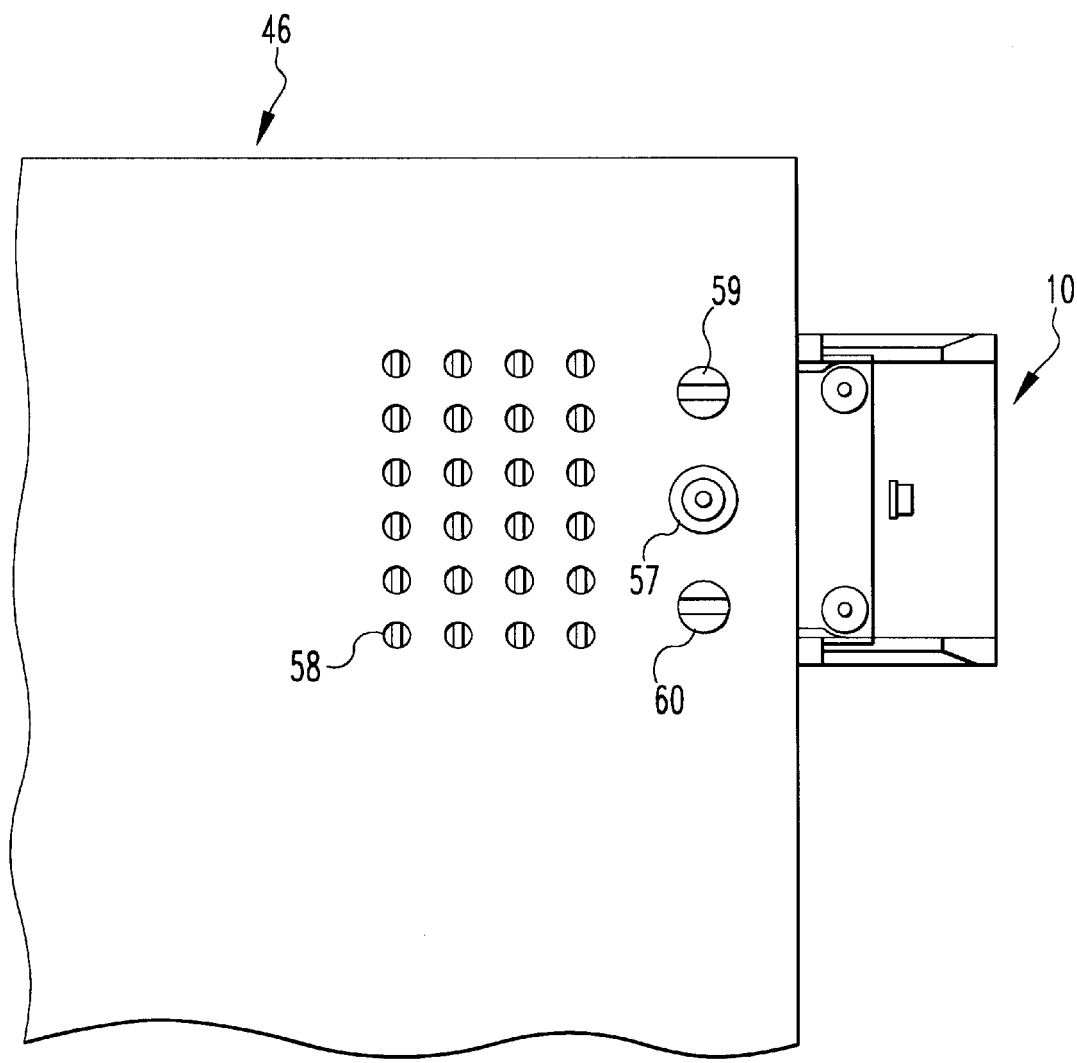
FIG. 2b is a bottom plan view of the receptacle and wafer shown in FIG. 2 and a PCB on which it is mounted.
Figure 3:
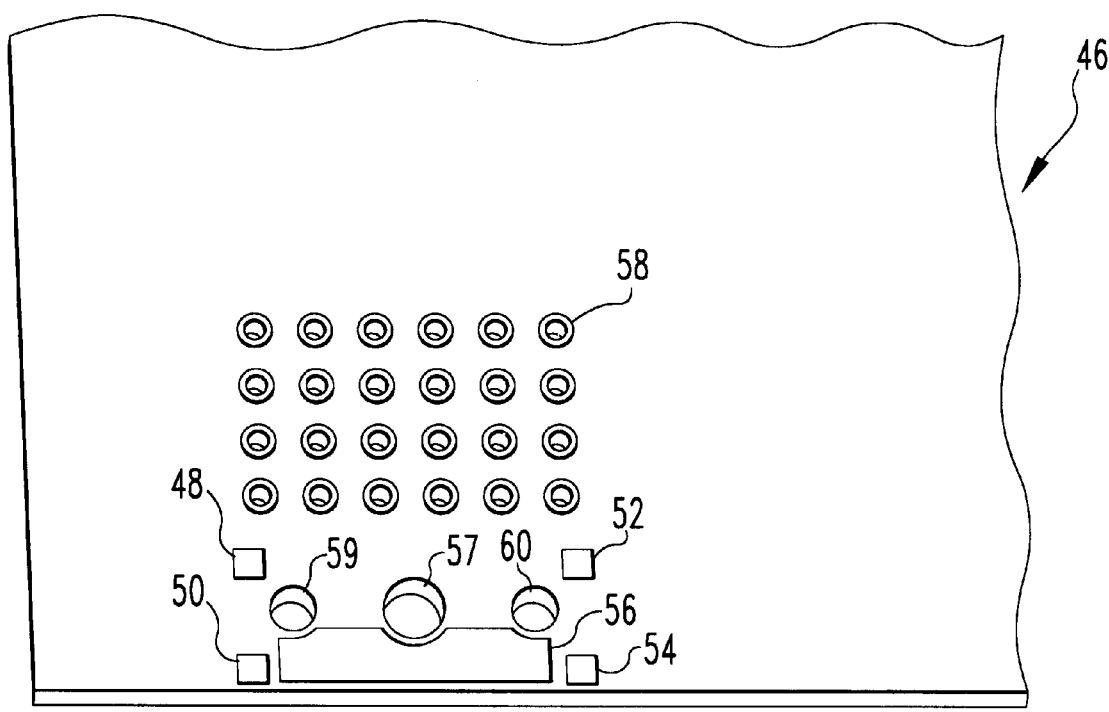
FIG. 3 is a top perspective view of a PCB on which the connector shown in FIG. 1 may be mounted.

Referring to FIGS. 2a, 2b and 3, the PCB is shown generally in fragment at numeral 46. On the upper surface of the PCB are reference pads 48, 50, 52 and 54. The elongate pad 56 is positioned to be located opposite to the connector metal plate 16. Further, the recess 57 allows the free passage of the rivet peg 18, while the locating pins 12 and 14 are resiliently engaged in the recesses 59 and 60. The edge of such a board is located behind the ears as at ear 70 of this connector. Such boards are characterized in that they are thinner towards the edges, in addition to the surface waviness compared to the surface of the plastic underside 19. Such problems generally result in a mutual space between the connector and board. This is a significant problem which needs to be overcome, particularly when the connector length (or number of positions) increase. To start with prior to the reflow operation, once the connector sits on the PCB, the reference pads 48, 50, 52 and 54 of the board are in contact with the opposite four locations on the underside 19 of the connector.

Further, the board 46 contains terminal receiving apertures 58 which are plated through. As a mater of detail specific to one preferred process, a metal stencil (not shown) of a certain thickness with appropriately positioned apertures, is positioned over board in the connector area. This stencil with apertures extends not only over the area of apertures 58, but also the elongate pad area 56. Once the stencil is properly positioned and laid flat over board 46, the apertures can be filled by the soft solder paste (for example, in the area 58, see FIG. 2a), with surface leveling to the thickness of the stencil. The stencil is removed to leave a deposit of soft solder paste of a desired thickness and area in specified locations.

As can be seen from FIG. 1, after assembly of the metal plate 16 to the recessed zone of the connector, hot rivet pegs 18, 20 and 22 allow rigid fixation of this plate to the connector. The thickness of this plate 16 is such that its average surface is either flush or slightly under the surface level of the remaining connector underside 19. The board 46 (see FIG. 5) can be compensated for by a leveling effect on the soft paste located in the mutual space opposite to the plate 16. Once the connector assembly 10 is located on board, the terminals push through the solder deposit and enter the apertures 58. Simultaneously, the mutual space between the metal plate 16 and elongate pad 56, as previously explained, is adequately filled by the soft solder paste. Subsequent reflow will result in a melting of solder, while the surface tension ensures to drag the solder melt between the terminals and plated through holes, and also between plate 16 and board. Any surplus solder is trapped in the channel or space 36. This prevents conditions for short-circuit between adjacent terminals after reflow.

Figure 5:
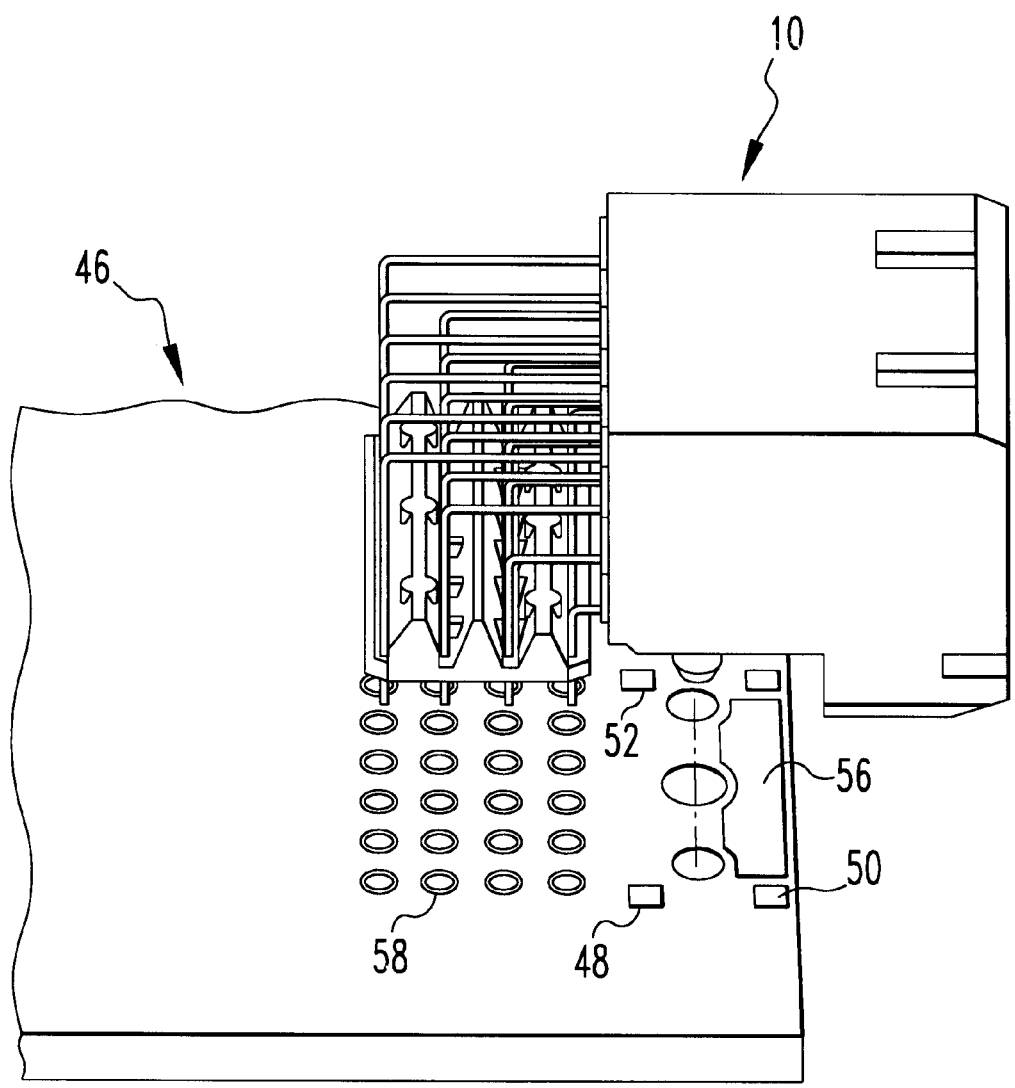
FIG. 5 is a top perspective view of a connector of FIG. 1 superimposed over a PCB prior to mounting.

Referring to FIG. 5, it will also be appreciated that the hold-down solderable surface 56 has a belt of soft paste, its top surface being flush with the reference surfaces 48, 50, 52 and 54. Such reference surfaces 48, 50, 52 and 54 are important for surface mount hold-down devices due to the inherent waviness of the board in relation to the potential length (positions) of connectors, and the fact that boards often tend to be thinner towards their edges.

Referring again to FIG. 1, usually the hold-down plate 16 is located on the connector underside 19 within a recessed area within perimeter 17 such that in the final assembly the surface of this hold-down plate is about 0.05 mm below the aforesaid underside surfaces. At the rear of the connector underside 19 and located in an intermediary space with the wafer 26, is located an open space 36. When this connector is lowered to engage the board, prior to reflow the resultant additional soft paste which is displaced is trapped in the open space 36. This measure is important to restrict the movement of molten solder paste in a specific area, thus preventing undesirable short circuits with tracks in the vicinity. Also in the connector position, the location pins 12 and 14 resiliently engage the holes 59 and 60 while the hot riveted peg 18 passes freely through another hole 57. The other two hot rivet pegs 20 and 22 do not need to fit holes since their location is beyond the edge of the PCB (see FIG. 5).

Figure 4:
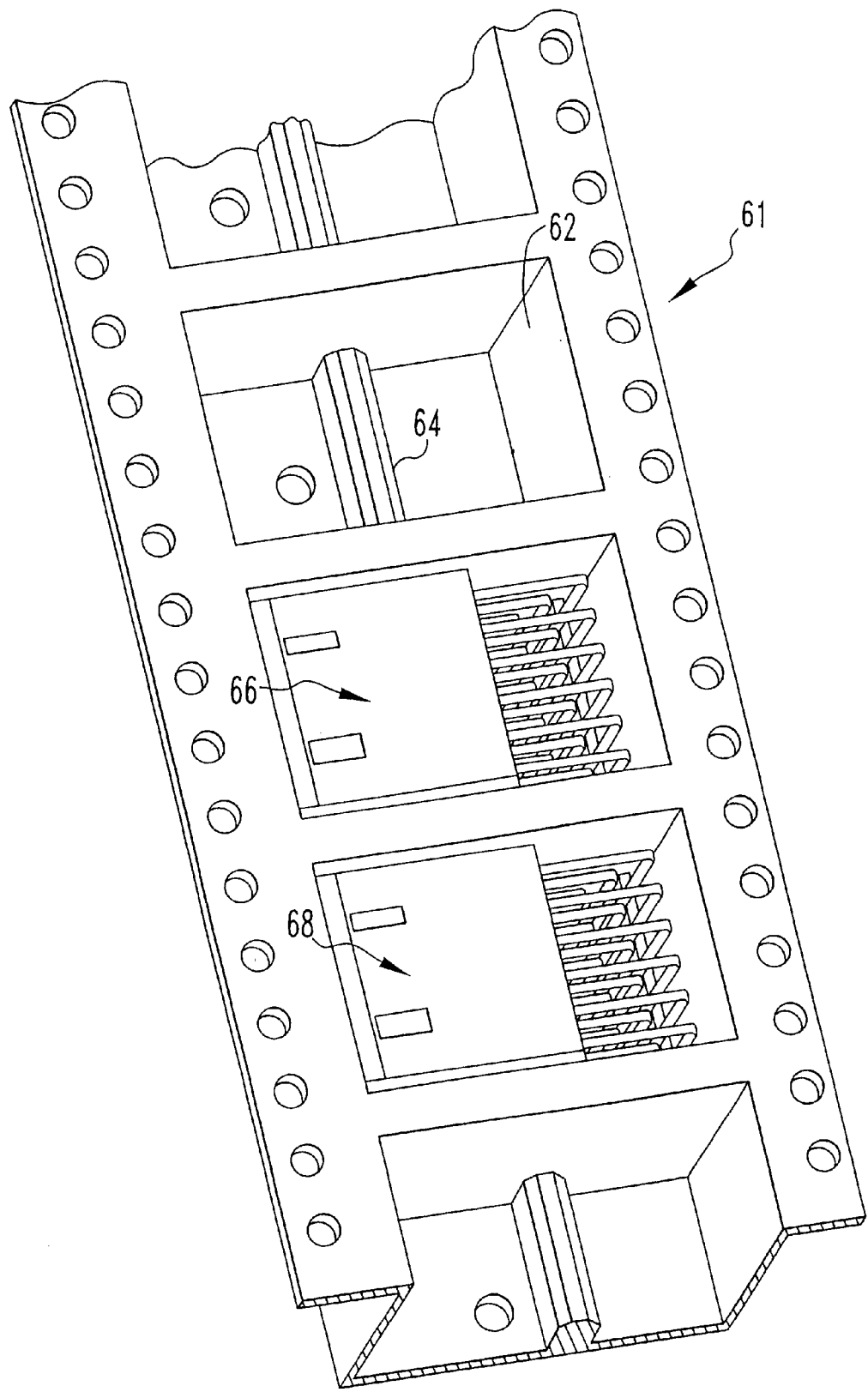
FIG. 4 is a top perspective view of a tape carrying system holding two connectors similar to that shown in FIG. 1.

Referring to FIG. 4, it will be seen that the receptacle may be transported on a tape shown generally at number 60 which has a plurality of recesses as at recess 62 and a longitudinal axial rib 64. Receptacles as described above such as 66 and 68 are positioned in the recesses and are then subsequently removed by vacuum pick up on their upper surfaces for placement on a PCB.

The embodiment and method shown for a horizontal receptacle connector may equally be adapted to a vertical positioned connector, and this concept can equally apply to plug connectors.

It will be appreciated that a connector has been described which is adapted to be efficiently placed on a PCB, particularly by video positioning.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical connector mounted to a substrate with assistance from a video positioning apparatus, the connector comprising:

a housing having a lower surface;

a plurality of terminals extending through said housing;

a metal surface mount hold-down plate on said lower surface and adapted to secure the connector to the substrate; and a wafer through which said terminals extend;

wherein said wafer is made from a material having a dark color so that said terminals and said wafer have different optical characteristics whereby the video positioning apparatus can sense said different optical characteristics and properly position said terminals relative to the substrate during mounting.

2. The electrical connector as recited in claim 1, wherein said lower surface includes a recess and said metal hold-down plate resides in said recess.

3. The electrical connector as recited in claim 2, wherein said metal hold-down plate resides entirely within said recess.

4. The electrical connector as recited in claim 3, wherein said metal hold-down plate is generally flush with said lower surface.

5. The electrical connector as recited in claim 3, wherein said lower surface includes a peg, said peg retaining said metal hold-down plate.

6. The electrical connector as recited in claim 5, wherein said peg retains said metal hold-down plate by hot riveting.

7. The electrical connector as recited in claim 1, wherein said metal hold-down plate is located entirely within a periphery of said lower surface.

8. The electrical connector as recited in claim 1, wherein said dark color is black.

* * * * *